(12) United States Patent
Asakawa et al.

(10) Patent No.: US 9,437,779 B2
(45) Date of Patent: *Sep. 6, 2016

(54) SEMICONDUCTOR LIGHT EMITTING DEVICE AND METHOD FOR MANUFACTURING THE SAME

(71) Applicant: KABUSHIKI KAISHA TOSHIBA, Minato-ku (JP)

(72) Inventors: Koji Asakawa, Kanagawa-ken (JP); Akira Fujimoto, Kanagawa-ken (JP); Ryota Kitagawa, Tokyo (JP); Kumi Masunaga, Kanagawa-ken (JP); Takanobu Kamakura, Fukuoka-ken (JP); Shinji Nunotani, Fukuoka-ken (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/741,789

(22) Filed: Jun. 17, 2015

(65) Prior Publication Data

US 2015/0311393 A1 Oct. 29, 2015

Related U.S. Application Data

(63) Continuation of application No. 13/222,281, filed on Aug. 31, 2011, now Pat. No. 9,159,880.

(30) Foreign Application Priority Data

Mar. 3, 2011 (JP) .................................. 2011-046266

(51) Int. Cl.
*H01L 33/62* (2010.01)
*H01L 33/38* (2010.01)
(Continued)

(52) U.S. Cl.
CPC ........... *H01L 33/38* (2013.01); *H01L 33/0025* (2013.01); *H01L 33/32* (2013.01);
(Continued)

(58) Field of Classification Search
CPC .................. H01L 33/32; H01L 33/38; H01L 2933/0016; H01L 33/405
See application file for complete search history.

(56) References Cited

U.S. PATENT DOCUMENTS 5,345,092 A * 9/1994 Kurihara ................. H01L 33/24
257/13
6,258,618 B1 * 7/2001 Lester ..................... H01L 33/46
257/E33.068
(Continued)

FOREIGN PATENT DOCUMENTS

JP 63-84084 4/1988
JP 10-256602 9/1998
(Continued)

OTHER PUBLICATIONS

Office Action issued Dec. 10, 2013, in Japanese Patent Application No. 2011-46266, filed Mar. 3, 2011 (with English language translation).
(Continued)

*Primary Examiner* — Jaehwan Oh
(74) *Attorney, Agent, or Firm* — Oblon, McClelland, Maier & Neustadt, L.L.P.

(57) ABSTRACT

According to one embodiment, a semiconductor light emitting device includes a structure, a first electrode layer, and a second electrode layer. The structure includes a first semiconductor layer, a second semiconductor layer and a light emitting layer provided between the first semiconductor layer and the second semiconductor layer. The first electrode layer is provided on the first semiconductor layer side of the structure. The first electrode layer is made of metal and contains a portion contacting the first semiconductor layer. The second electrode layer is provided on the second semiconductor layer side of the structure. The second electrode layer has a metal portion with a thickness of not less than 10 nanometers and not more than 50 nanometers, and a plurality of openings piercing the metal portion, each of the openings having an equivalent circle diameter of not less than 10 nanometers and not more than 5 micrometers.

13 Claims, 8 Drawing Sheets

(51) Int. Cl.
*H01L 33/32* (2010.01)
*H01L 33/40* (2010.01)
*H01L 33/00* (2010.01)
*H01L 33/20* (2010.01)

(52) U.S. Cl.
CPC .......... *H01L 33/40* (2013.01); *H01L 33/0079* (2013.01); *H01L 33/20* (2013.01); *H01L 33/382* (2013.01); *H01L 2933/0016* (2013.01)

(56) References Cited

U.S. PATENT DOCUMENTS

| | | | |
|---|---|---|---|
| 6,565,763 B1 | 5/2003 | Asakawa et al. | |
| 6,998,649 B2* | 2/2006 | Hata | B82Y 20/00 257/745 |
| 7,057,212 B2* | 6/2006 | Kim | H01L 33/387 257/918 |
| 7,090,784 B2 | 8/2006 | Asakawa et al. | |
| 7,485,479 B2* | 2/2009 | Seong | H01L 33/42 438/128 |
| 7,485,897 B2* | 2/2009 | Seong | H01L 33/40 257/81 |
| 7,517,466 B2 | 4/2009 | Asakawa et al. | |
| 7,538,360 B2* | 5/2009 | Fudeta | H01L 33/32 257/98 |
| 7,569,863 B2* | 8/2009 | Ueda | H01L 33/08 257/89 |
| 7,856,040 B2* | 12/2010 | Bour | B82Y 20/00 372/43.01 |
| 8,043,520 B2 | 10/2011 | Asakawa et al. | |
| 8,101,964 B2* | 1/2012 | Kitagawa | H01L 33/38 257/99 |
| 2005/0067625 A1* | 3/2005 | Hata | B82Y 20/00 257/81 |
| 2005/0156185 A1* | 7/2005 | Kim | H01L 33/387 257/99 |
| 2005/0184299 A1* | 8/2005 | Matsumura | H01L 21/28575 257/79 |
| 2005/0184305 A1* | 8/2005 | Ueda | H01L 33/08 257/99 |
| 2006/0097278 A1* | 5/2006 | Goto | H01S 5/0207 257/103 |
| 2007/0155032 A1* | 7/2007 | Kim | H01L 33/20 438/22 |
| 2007/0200122 A1* | 8/2007 | Kim | H01L 33/08 257/79 |
| 2009/0079322 A1* | 3/2009 | Tsutsumi | H01L 31/022491 313/349 |
| 2009/0211783 A1 | 8/2009 | Tsutsumi et al. | |
| 2009/0242925 A1* | 10/2009 | Kitagawa | H01L 33/38 257/99 |
| 2009/0261372 A1* | 10/2009 | Ueda | H01L 33/08 257/98 |
| 2010/0074292 A1* | 3/2010 | Bour | B82Y 20/00 372/45.011 |
| 2011/0049556 A1* | 3/2011 | Fujimoto | H01L 33/38 257/99 |
| 2012/0018764 A1* | 1/2012 | Choi | H01L 33/20 257/99 |

FOREIGN PATENT DOCUMENTS

| | | |
|---|---|---|
| JP | 2000-174339 | 6/2000 |
| JP | 2001-148511 | 5/2001 |
| JP | 2002-33512 | 1/2002 |
| JP | 2003-309286 | 10/2003 |
| JP | 2004-71655 | 3/2004 |
| JP | 2004-119839 | 4/2004 |
| JP | 2005-39264 | 2/2005 |
| JP | 2005-64475 | 3/2005 |
| JP | 2009-231689 | 10/2005 |
| JP | 2006-245379 | 9/2006 |
| JP | 2007-123446 | 5/2007 |
| JP | 2007-273746 | 10/2007 |
| JP | 2008-187204 | 8/2008 |
| JP | 2008-263023 | 10/2008 |
| JP | 2010-520640 | 6/2010 |

OTHER PUBLICATIONS

Japanese Office Action issued Mar. 26, 2013, in Patent Application No. 2011-046266 (with English-language translation).
Office Action issued Jun. 24, 2014 in Japanese Patent Application No. 2011-46266 with English language translation.
Japanese Office Action (trial for decision) issued Sep. 30, 2014 in Japanese Patent Application No. 2011-46266 (Appeal 2013-17891) with English translation.

* cited by examiner ered to the embodiment;
SEMICONDUCTOR LIGHT EMITTING DEVICE AND METHOD FOR MANUFACTURING THE SAME

CROSS-REFERENCE TO RELATED APPLICATION

This is a continuation application based upon and claiming the benefit of priority under 35 U.S.C. §120 of U.S. application Ser. No. 13/222,281, filed Aug. 31, 2011, which claims the benefit of priority from the prior Japanese Patent Application No. 2011-46266, filed on Mar. 3, 2011; the entire contents of which are incorporated herein by reference.

FIELD

Embodiments described herein relate generally to a semiconductor light emitting device and a method for manufacturing the same.

BACKGROUND

The semiconductor light emitting device is equipped with an electrode that contacts a surface of a semiconductor layer. The semiconductor light emitting device emits light as a result of an electric current from the electrodes. A comparatively large light emitting device is desired for lighting equipments. For this reason, thin wire electrodes have been considered that extend from pad electrodes along a top surface of a semiconductor. Further, metal thin electrodes have also been considered that have fine openings of nanometer (nm) scale in them and cover all over the light emitting surfaces for semiconductor light emitting devices. However, a further increase in brightness is desired in semiconductor light emitting devices.

DETAILED DESCRIPTION

Figure 1:
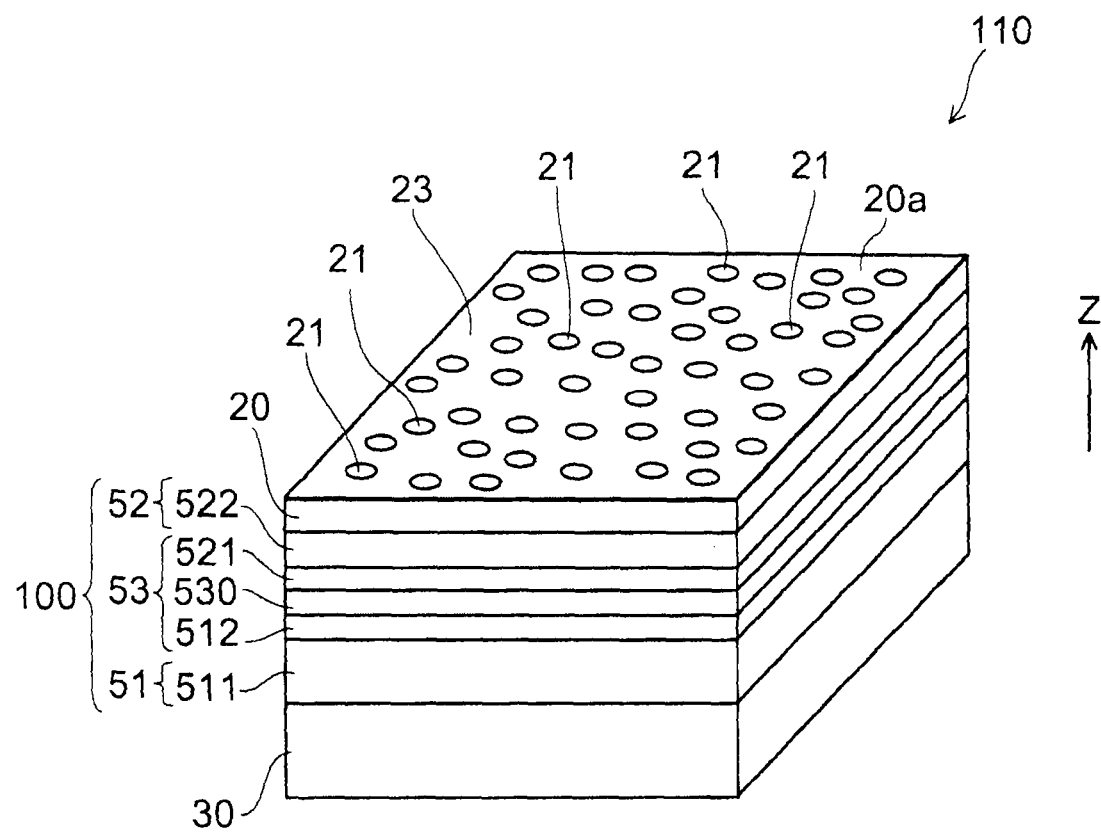
FIG. 1 is a schematic perspective view illustrating a configuration of a semiconductor light emitting device according to an embodiment.

In general, according to one embodiment, a semiconductor light emitting device includes a structure, a first electrode layer, and a second electrode layer.

The structure includes a first semiconductor layer of a first conductivity type, a second semiconductor layer of a second conductivity type and a light emitting layer provided between the first semiconductor layer and the second semiconductor layer.

The first electrode layer is provided on the first semiconductor layer side of the structure. The first electrode layer is made of metal and contains a portion contacting the first semiconductor layer.

The second electrode layer is provided on the second semiconductor layer side of the structure. The second electrode layer includes a metal portion with a thickness of not less than 10 nanometers and not more than 50 nanometers along a direction from the first semiconductor layer toward the second semiconductor layer, and a plurality of openings piercing the metal portion, each of the openings viewed in the direction having an equivalent circle diameter of not less than 10 nanometers and not more than 5 micrometers.

In general, according to one other embodiment, A method for manufacturing a semiconductor light emitting device includes forming a structure including a first semiconductor layer of a first conductivity type, a second semiconductor layer of a second conductivity type and a light emitting layer provided between the first semiconductor layer and the second semiconductor layer on a substrate. The method includes forming a metal layer on the second semiconductor layer with a thickness of not less than 10 nanometers and not more than 50 nanometers along a direction from the first semiconductor layer toward the second semiconductor layer. The method also includes forming a mask pattern on the metal layer, and forming a second electrode including a plurality of openings by etching the metal layer with the mask pattern, each of the openings viewed in the direction having an equivalent circle diameter of not less than 10 nanometers and not more than 5 micrometers. Further, the method includes forming a first electrode on the first semiconductor layer side of the structure after separating the substrate from the structure, the first electrode layer being made of metal and containing a portion contacting the first semiconductor layer.

Embodiments of the invention will now be described with reference to the drawings.

Note that the drawings are schematic or conceptual in nature, and relationships between thicknesses and widths of each portion, ratios between sizes of portions and the like are not therefore necessarily identical to the actual relationships and ratios. Also, even where identical portions are depicted, dimensions and ratios may appear differently depending on the drawing.

Further, in the drawings and specification of this application, the same numerals are applied to elements that have already appeared in the drawings and been described, and repetitious detailed descriptions of such elements are omitted.

Also, in the following explanation, examples are given as examples wherein a first conductivity type is n-type, and a second conductivity type is p-type.

First Embodiment

FIG. 1 is a schematic perspective view illustrating a configuration of a semiconductor light emitting device according to a first embodiment.

The semiconductor light emitting device 110 according to the first embodiment includes a structure 100, a first electrode layer 30, and a second electrode layer 20.

The structure 100 includes a first semiconductor layer 51 of a first conductivity type, a second semiconductor layer of a second conductivity type, and an active layer 53 provided between the first semiconductor layer 51 and the second semiconductor layer 52. Each layer of the structure 100 includes, for example, nitride semiconductors.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

The first semiconductor layer 51 includes, for example, a current diffusion layer 511 of GaN.

The second semiconductor layer 52 includes a current diffusion layer 522. Specifically, the current diffusion layer 522 formed from, for example, p-type GaN is provided on a cladding layer 521 formed from, for example, p-type GaN. In the embodiment, for reasons of convenience, the current diffusion layer 522 is included in the second semiconductor layer 52.

The active layer 53 is provided between the first semiconductor layer 51 and the second semiconductor layer 52. In the semiconductor light emitting device 110, the heterostructure active layer 53 is, for example, configured by the cladding layer 512 made from n-type GaN, a light emitting layer 530 and a cladding layer 521.

The first semiconductor layer 51, the active layer 53 and the second semiconductor layer 52 included in the structure 100 are epitaxial layers grown on a substrate used for the crystal growth (such as a sapphire substrate) not illustrated in the drawings.

The second electrode layer 20 is provided on the second semiconductor layer 52 side of the structure 100. Specifically, the second electrode layer 20 is provided on the opposite side of the second semiconductor layer 52 to the first semiconductor layer 51. In the second electrode layer 20, Au and Ag, or Au and Ag to which some impurities have been added may, for example, be used, as described later.

In the embodiment, for convenience of explanation, the second semiconductor layer 52 side of the structure 100 is defined as a top surface side or top side, and the first semiconductor layer 51 side of the structure 100 is defined as a back surface side or bottom side. Also, a direction from the first semiconductor layer 51 toward the second semiconductor layer 52 along a stacking direction is defined as a "Z-axis direction".

The second electrode layer 20 includes a metal portion 23 and a plurality of openings 21. The openings 21 pierce through the metal portion 23 along the Z direction. An equivalent circle diameter of the openings 21 viewed in the Z direction is not less than 10 nm and not more than 5 µm.

Here, the equivalent circle diameter is defined by the following equation.

$$\text{Equivalent circle diameter} = 2 \times (\text{Area}/\pi)^{1/2}$$

Here, "Area" is the area of the openings 21 when viewed in the Z direction.

The openings 21 are not necessarily circular in shape. Thus, in the embodiment, the openings 21 are specified using the equivalent circle diameter definition described above.

The first electrode layer 30 is provided on the first semiconductor layer 51 side of the structure 100. Specifically, the first electrode layer 30 is provided on the back surface side of the first semiconductor layer 51 opposite to the second semiconductor layer 52. The first electrode layer 30 is made of metal. The first electrode layer 30 includes a portion that contacts a back surface side of the first semiconductor layer 51, and this portion provides electrical continuity with the first semiconductor layer 51. The first electrode layer may contain Ag, for example. The first electrode layer 30 may, for example, be formed by plating.

In the semiconductor light emitting device 110 of this type, a face on which the second electrode layer 20 is formed is used as a main light emitting face. In other words, by applying a predetermined voltage between the second electrode layer 20 and the first electrode layer 30, light is emitted from the light emitting layer 530. The light is mainly emitted to the outside from a major surface 20a of the second electrode layer 20.

In the semiconductor light emitting device 110 according to the first embodiment, the openings 21 are provided in the second electrode layer 20, and light can therefore be efficiently emitted to the outside while current diffusion to the light emitting layer 530 given by the second electrode layer 20 is maintained. Here, the second electrode layer 20 includes the fine openings 21, which, for example, have sizes approximating to not less than 10 nm and not more than 5 µm.

Further, in the semiconductor light emitting device 110, the second electrode layer 20 and the first electrode layer 30 are arranged to oppose to each other and metal is used as the first electrode layer 30. Hence, current diffuses in the second electrode layer 20 and current concentrations from the light emitting layer 530 toward the first electrode layer 30 can be suppressed.

Further, in the semiconductor light emitting device 110, the first electrode layer 30 made of metal is provided on the back surface side of the first semiconductor layer 51, enabling efficient release of heat generated in the semiconductor light emitting device 110 via the first electrode layer 30.

Thus, according to the semiconductor light emitting device 110, a luminous efficiency of the light emitting layer 530 is improved, and it is possible to increase a brightness of the light emitted from the second electrode layer 20.

An example of the semiconductor light emitting device 110 is explained below.

The semiconductor light emitting device 110 includes, for example, a current diffusion layer 511 of GaN. A heterostructure including the cladding layer 512 made, for example, from n-type GaN doped with Si, the light emitting layer 530 containing InGaN and GaN, and a cladding layer 521 made from p-type AlGaN are formed on the current diffusion layer 511.

The light emitting layer 530 may be a Multiple Quantum Well (MQW) configuration with, for example, repeatedly alternating barrier layers (GaN) and well layers (InGaN). Alternatively, the light emitting layer 530 may have a Single Quantum Well (SQW) configuration provided with a combination of a single well layer sandwiched by barrier layers.

The current diffusion layer 522 made, for example, from p-type GaN is formed on the light emitting layer 530. Further, the current diffusion layer 522 may be doped with carbon or the like. In this way, a resistance value of the current diffusion layer 522 is decreased, making it easier for an ohmic contact to be formed with the second electrode layer 20. Note that the configuration of these semiconductor layers is an example, and the embodiment is not limited to this configuration.

A contact layer may, for example, be formed on the current diffusion layer 522, and the second electrode layer 20 may be formed on the current diffusion layer 522 via the contact layer.

It is sufficient that the material used for the contact layer be appropriately selected based on, for example materials used in the current diffusion layer 522 which is adjacent to the contact layer, and the material used in the second electrode layer 20.

The second electrode layer 20 may include, for example, an Ni/Ag—Pd—Cu stacked film as the p-side electrode. The plurality of the openings 21 is provided in the second electrode layer 20, piercing the metal portion 23 along the Z-axis direction. Each of the openings 21 may be formed with regular or irregular size and may be disposed regularly or irregularly.

On the back surface side of the current diffusion layer 511, the first electrode layer 30 of the n-side is formed, for example, from Ag. The first electrode layer 30 includes a portion that contacts the first semiconductor layer 51, and the portion provides conductivity between the first electrode layer 30 and the first semiconductor layer 51. A thickness along the Z-axis direction of the first electrode layer 30 is preferably not less than 1 μm. Specifically, the structure 100 is formed by epitaxial layers grown on a substrate and a thickness of the structure 100 along the Z-axis direction is extremely thin. Hence, after the substrate is separated from the structure 100, the first electrode layer 30 formed on the back surface side of the structure 100 serves to strengthen the structure 100. Hence, by setting the thickness of the first electrode layer 30 to at least 1 μm, the structure 100 can be sufficiently reinforced.

Here, the thickness of the structure 100 along the Z-axis direction is not less than several μm and not more than 20 μm. The thickness of the first electrode layer 30 along the Z direction is preferably not less than 1 μm and not more than 500 μm, and more preferably not less than 10 μm and not more than 100 μm.

In the embodiment, the second electrode layer 20 and the first electrode layer 30 oppose each other across the structure 100.

Also, in the semiconductor light emitting device 110 according to the embodiment, light emitted from the light emitting layer 530 is emitted to the outside from whole surfaces of the second semiconductor layer 52 on which the second electrode layer 20 is provided. The semiconductor light emitting device 110 emits light with, for example, a central wavelength of not less than 400 nm and not more than 650 nm.

Next, a current flow of the semiconductor light emitting device 110 according to the embodiment is described.

Figure 2A:
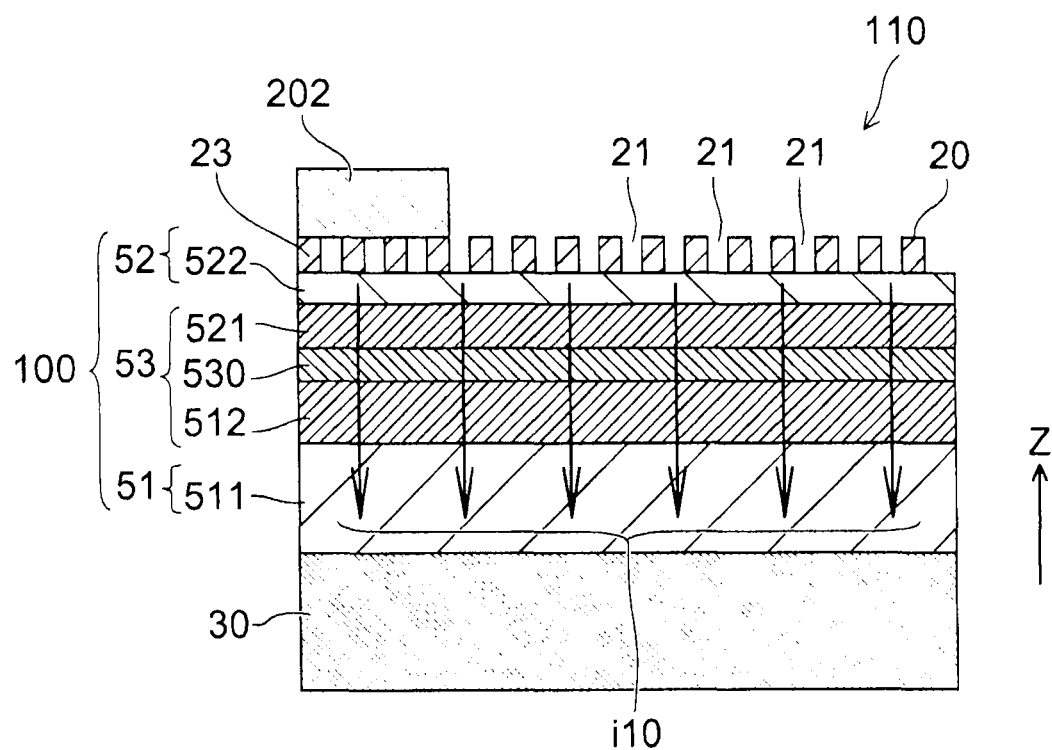
FIG. 2A is a schematic cross-sectional view illustrating the semiconductor light emitting device according to the embodiment.
Figure 2B:
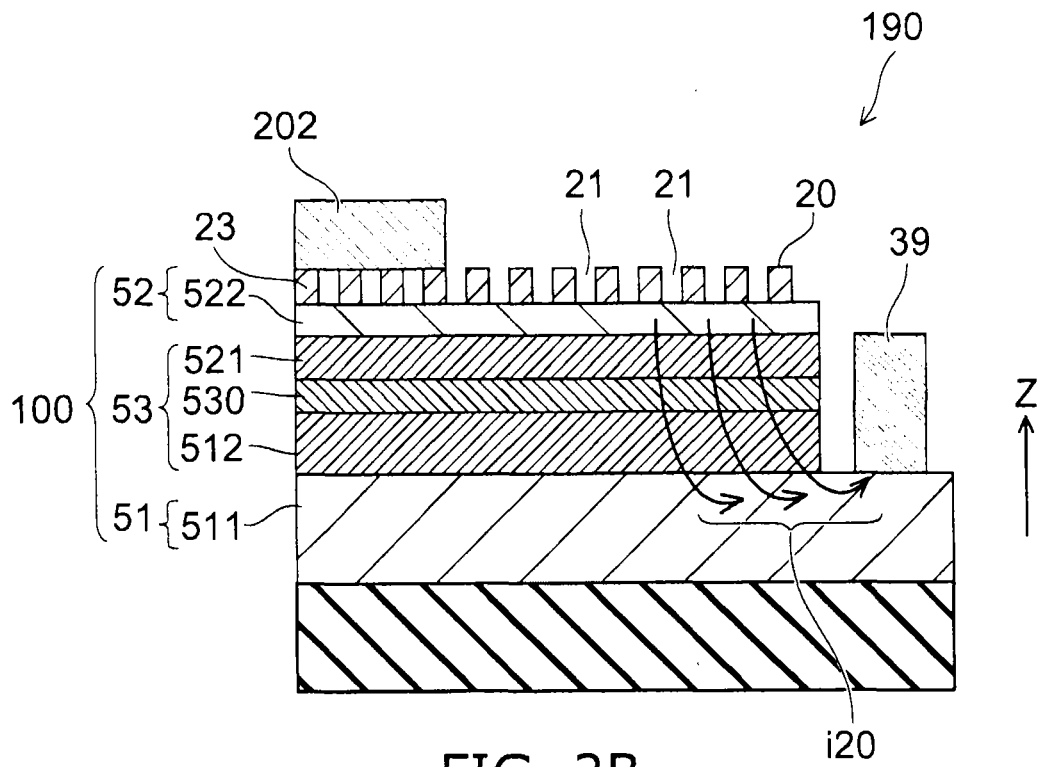
FIG. 2B is a schematic cross-sectional view illustrating a semiconductor light emitting device according to a reference example.

FIGS. 2A and 2B are schematic cross-sectional views illustrating an example of the semiconductor light emitting device used in the simulation.

FIG. 2A is a schematic cross-sectional view illustrating the semiconductor light emitting device 110 according to the embodiment.

In the semiconductor light emitting device 110, the first electrode layer 30 is provided on the back surface side of the first semiconductor layer 51.

FIG. 2B is a schematic cross-sectional view illustrating a semiconductor light emitting device 190 according to a reference example.

In the semiconductor light emitting device 190, the first electrode layer 39 is provided on a portion of the top surface side of the first semiconductor layer 51.

Note that for both drawings, the pad electrode 202 may be in the center or at an edge of a chip.

Figure 3A:
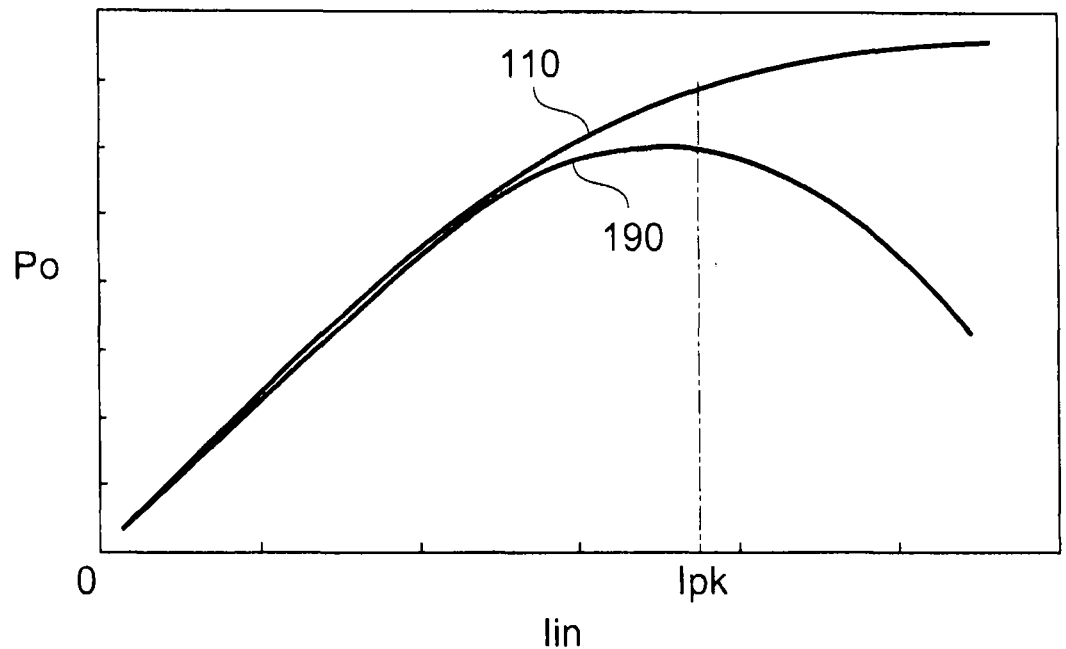
FIGS. 3A and 3B are graphs illustrating the characteristics of semiconductor light emitting devices.
Figure 3B:
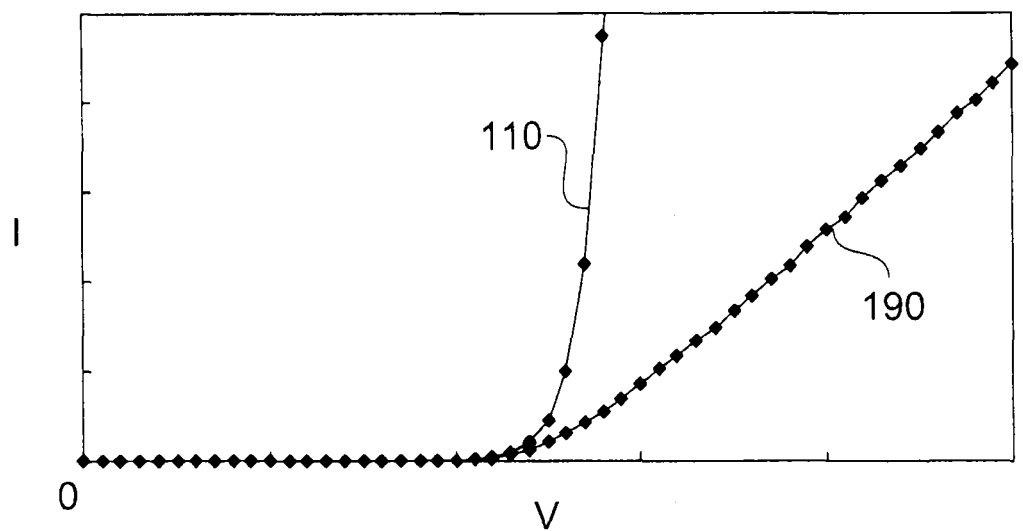

FIGS. 3A and 3B are graphs illustrating the characteristics of semiconductor light emitting devices.

FIG. 3A illustrates current-power characteristics of semiconductor light emitting devices.

FIG. 3B illustrates voltage-current characteristics of semiconductor light emitting devices.

In the semiconductor light emitting device 110 according to the embodiment, a plurality of nm scale openings 21 piercing the metal portion 23 is provided in the second electrode layer 20. Since such the second electrode layer 20 having the openings 21 is made from metal, compared with the semiconductor or oxide transparent electrodes such as indium tin oxide (ITO) or the like that normally constitutes the current diffusion layer, electrical conductivity is one or two or more orders of magnitude larger and thermal conductivity is also high. Therefore, when the semiconductor light emitting device 110 is manufactured with such the second electrode layer 20, a forward direction voltage (Vf) is lower compared with a case in which ITO is used. As a result, a current concentration, that is, the current is concentrated in only one portion of the light emitting layer 530, is reduced. Therefore, light is emitted more uniformly over the entire light emitting layer 530, and the brightness increases.

In the semiconductor light emitting device 110 according to the embodiment, the equivalent circle diameter of the openings 21 in the second electrode layer 20 is not less than 10 nm and not more than 5 μm. Further, the thickness of the second electrode layer 20 is not less than 10 nm and not more than 200 nm.

In other words, in the semiconductor light emitting device 110, temperature rise of the semiconductor light emitting device 110 is suppressed by obtaining a high heat dissipation through provision of a relatively large second electrode layer 20. Further, temperature rise of the semiconductor light emitting device 110 is suppressed by adjusting the size (for example the equivalent circle diameter) of the openings 21 provided in the second electrode layer 20. In other words, a series resistance is reduced by lowering a forward direction voltage of the semiconductor light emitting device 110, so that heat generation itself can be reduced.

In order to realize this effect, it is sufficient that the current flow uniformly over the entire face of the second semiconductor layer 52 from the second electrode layer 20 having the openings 21. In order that the current can flow uniformly to the second semiconductor layer 52, sizes of the openings 21 and gaps between the centers of the openings 21 are limited to a certain extent.

Although the preferable sizes and gaps depends on the doping concentration of the semiconductor layer and current flows in it, the reaching range of the flow is up to approximately 5 μm from the edge of the second electrode layer 20 according to simulations. Furthermore, the range of reaching distance for which sufficient conductivity is guaranteed without rise in forward direction voltage is not more than 1 μm. In other words, if the diameter of the openings is not less than 5 μm, there will be a region where current does not flow and it cannot lower the series resistance and the forward direction voltage. Hence, an upper limit on the average opening diameter of the openings 21 is not more than 5 μm and preferably not more than 1 μm.

As in the semiconductor light emitting device 190 illustrated in FIG. 2B, when the second electrode 39 is placed on a portion of the first semiconductor layer 51, current diffused from the second electrode layer 20 is concentrated in portions near the first electrode 39. In other words, current supplied from the pad electrode 202 is diffused along the second electrode layer 20 from the second electrode layer 20 having the openings 21. The current flows toward the first electrode 39 via the second semiconductor layer 52, the light emitting layer 530, and the first semiconductor layer 51. As a result, current concentrations occur in portions (i20) near the first electrode 39 in the semiconductor light emitting device 190, since the first electrode 39 is placed on a portion of a top surface side of the first semiconductor layer 51.

As in the semiconductor light emitting device 190 illustrated in FIG. 2B, when the second electrode 39 is provided on a portion of the first semiconductor layer 51, current diffused by the second electrode layer 20 is concentrated in portions near to the first electrode layer 39. In other words, current supplied from the pad electrode 202 is diffused by the second electrode layer 20 having the openings 21 along the second electrode layer 20. The current flows toward the first electrode layer 39 via the second semiconductor layer 52, the light emitting layer 530, and the first semiconductor layer 51. In the semiconductor light emitting device 190, the first electrode layer 39 is provided on a portion of a top surface side of the first semiconductor layer 51, and current concentrations therefore occur in portions (i20) near the first electrode layer 39.

A resistance value of the first electrode layer 39 of the semiconductor light emitting device 190 is greater than a resistance value of the first electrode layer 30 of the semiconductor light emitting device 110. The difference in resistance values appears as difference in the voltage-current characteristics as illustrated in FIG. 3B.

As illustrated in FIG. 3A, in the current-power characteristics of the semiconductor light emitting device 190, power saturation occurs when the current exceeds a value (Ipk). In the semiconductor light emitting device 190, the resistance value of the first electrode layer 39 is greater than a resistance value of the first electrode layer 30, and heat in the region of the first electrode layer 39 increases with an increase in current. It is considered that the increase in heat causes the reduction in the power at currents exceeding the current Ipk.

On the other hand, in the semiconductor light emitting device 110 according to the embodiment, the first electrode layer 30 is formed on a back surface side of the first semiconductor layer 51, as illustrated in FIG. 2A. In other words, the second electrode layer 20 and the first electrode layer 30 oppose each other across the structure 100. Also, the first electrode layer 30 contacts the first semiconductor layer 51 over a wide area in comparison to the first electrode layer 39. Hence, the resistance value of the first electrode layer 30 is low in comparison to the resistance value of the first electrode layer 39. For this reason, in the semiconductor light emitting device 110, current diffused by the second electrode layer 20 flows uniformly (i10) toward the first electrode layer 30. Hence, because the metal reduces the resistance value of electrode portions by an order of magnitude in comparison to semiconductor current diffusion layers, the current increases linearly when the threshold voltage is exceeded, as illustrated in FIG. 3B. As a result, the semiconductor light emitting device 110 has excellent voltage-current characteristics.

As illustrated in FIG. 3A, in the current-power characteristics of the semiconductor light emitting device 110, the power increases as the current increases. Moreover, power saturation does not occur when the current exceeds the current Ipk. As described above, in the semiconductor light emitting device 110, the resistance value of the first electrode layer 30 is lower than the resistance value of the first electrode layer 39, and very little heat is therefore generated in the region of the first electrode layer 30 as the current increases. Moreover, even if heat is generated, the heat is released efficiently to the outside from the first electrode layer 30. Hence, the semiconductor light emitting device 110 can be considered to have excellent current-power characteristics as a result of not being easily affected by the heat that accompanies the increases in current.

By providing openings with diameters sufficiently smaller than the wavelength of the light emitted from the light emitting layer 530 in the second electrode layer 20, the second electrode layer 20 can be made to function as a light-transmitting electrode despite being made of metal. The reason for this is that linear distances of continuous metal portions unimpeded by the openings are significantly shorter than the wavelength of the light. Hence, when the second electrode layer 20 is irradiated with light, the motion of free electrons excited by the electric field of the light is impeded, preventing light of such wavelengths being reflected and thus making the metal transparent.

According to Drude's theory, which describes reflection by metals, a target material is assumed to have a uniform structure that is sufficiently large relative to the wavelength of the light that is irradiating it. When a substance is irradiated with light having a frequency that is lower than a plasma frequency, the free electrons within the substance are polarized by the electric field of the light. This polarization is induced in a direction to cancel out the electric field of the light. As a result of the cancelling of the electric field of the light by the induced polarization of the electrons, the light is prevented from passing through the substance, and a so-called plasma reflection occurs. Here, it is considered that if the substance in which polarization of the electrons is induced is sufficiently small relative to the wavelength of light, motion of the electrons is restricted by geometric structure and cancelling of the electric field of the light is not possible. Structurally, this effect can be achieved by making the diameter of the openings sufficiently small relative to the wavelength of the light in question.

Hence, to obtain the effect whereby a light transmittance in the second electrode layer 20 (transmittance of light generated by the light emitting layer 530 to the outside) exceeds the value normally expected for the opening ratio (area of openings with respect to area of second electrode layer 20), the equivalent circle diameter is preferably not more than approximately ½ of the central wavelength of the light. For example, in the case of visible light, the equivalent circle diameter of the openings 21 may be not more than 300 nm.

The lower limit for the equivalent circle diameter of the openings 21 is not limited from the point of view of resistance value, but for ease of manufacture may be not less than 10 nm and preferably not less than 30 nm.

Also, it is preferable that for the material of the metal portion 23 of the second electrode layer 20, Ag or Au may, for example, be used as the base metal. As a result, the absorption losses are suppressed. In addition, the metal material of the metal portion 23 preferably uses at least one material selected from the group Al, Zn, Zr, Si, Ge, Pt, Rh, Ni, Pd, Cu, Sn, C, Mg, Cr, Te, Se, and Ti, or an alloy. Thereby, the ohmic properties, the close contact, and heat resistance properties are improved. Preferably the metal used as the material of the metal portion 23 has sufficient electrical conductivity and thermal conductivity. However, the embodiment is not limited to these, and any metal can be used.

Note also that, for example, an arbitrary two points of the metal portion 23 (the part where the openings 21 are not provided) of the second electrode layer 20 are continuous without discontinuity from a current supply source such as the pad electrode. This is to maintain a low resistance value to ensure electrical continuity.

Also, where a plurality of current supply sources is provided, it is sufficient that the metal portion 23 of the second electrode layer 20 be continuous in correspondence with the respective the current supply sources.

Moreover, the metal portion 23 is preferably continuous. In this way, uniformity of light emission by the semiconductor light emitting device 110 is improved. Also, the sheet resistance of the second electrode layer 20 is preferably not more than 10 Ω/square, and more preferably not more than 5 Ω/square. Lowering the sheet resistance markedly improves uniform emission and brightness. Also, the heat generated in the semiconductor light emitting device 110 is reduced.

In order to form a metal electrode on the semiconductor layer, a metal layer is formed on the semiconductor layer.

For example, in the electrode forming method in the case of a blue light emitting device, the ohmic contact may be made by forming a stacked film of Ni/Ag—Pd—Cu on a compound semiconductor layer of GaN and AlGaN or the like and then performing annealing.

In the semiconductor light emitting device 110 according to the embodiment, the metal layer is formed in the manner described above, and the second electrode layer 20 is formed by forming the openings 21 by a method that is described later. Here, if the second electrode layer 20 is too thin, the amount of dopant is reduced, and level of doping is insufficient. As a result, sufficient ohmic contact cannot be obtained, and this could cause the resistance value to increase.

In the experiment, it was found that if the thickness of the second electrode layer 20 is not less than 10 nm, it is possible to achieve sufficient ohmic contact. Also, if the thickness of the second electrode layer 20 is not less than 30 nm, the ohmicity is further improved. Conversely, the greater the thickness of the second electrode layer 20 the lower the resistance value. From the point of view of ensuring transmittance for the light emitted from the light emitting layer 530, a thickness of the second electrode layer 20 is preferably not more than 200 nm, and more preferably not more than 50 nm.

Here, in the second electrode layer 20 the reflectance of the metal material in the bulk state (bulk reflectance) for light of the wavelengths emitted from the light emitting layer 530 is not less than 70%. This is because when the reflectance is low for metal reflection, the light is converted into heat, which causes losses. In the second electrode layer 20, light that could not escape from the device is reflected back as light by the electrode. Hence, by providing a reflective layer (not illustrated) in a bottom part of the light emitting layer 530, this light can be reused and emitted again. Thus, the light emitted from the light emitting layer 530 passes through the second electrode layer 20.

Second Embodiment

The following is an explanation of a second embodiment. The second embodiment is a manufacturing method of a semiconductor light emitting device.

Examples of methods for manufacturing a semiconductor light emitting device according to a second embodiment include the methods (A) to (D) described below.

(A) Method Using Electron Beam Lithography

One method of forming the second electrode layer with openings is electron beam lithography. The method using electron beam lithography for manufacturing a semiconductor light emitting device according to the second embodiment includes the following processes.

Specifically, the manufacturing method includes: forming a structure on a substrate by an epitaxial crystal growth, the structure including a first semiconductor layer of a first conductivity type, a second semiconductor layer of a second conductivity type and a light emitting layer provided between the first semiconductor layer and the second semiconductor layer, and forming a metal layer on the second semiconductor layer (a1); forming a resist film on the metal layer (a2); irradiating the resist film with an electron beam and developing to form a resist layer having a plurality of first resist openings and second resist openings (a3), etching the metal layer using the resist layer as a mask to form a second electrode layer having a plurality of openings (a4), and, after separating the substrate from the structure, forming, on the first semiconductor layer side of the structure, a second electrode layer being made of metal and containing a portion contacting the first semiconductor layer (a5).

Also, in the forming of the second electrode layer (a4) in the embodiment, the plurality of openings is formed with each having an equivalent circle diameter of not less than 10 nm and not more than 5 µm.

Specifically, the semiconductor light emitting device is, for example, manufactured as follows.

FIGS. 4A to 4D are schematic cross-sectional views illustrating an example of a process of the method using electron beam lithography.

Figure 4A:
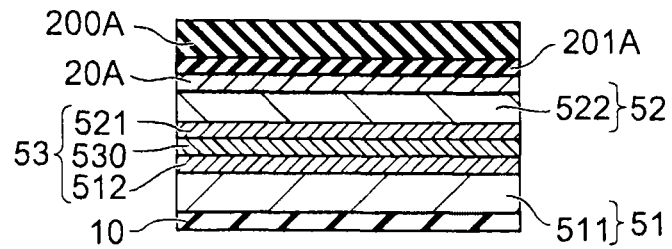
FIGS. 4A to 7H are schematic cross-sectional views illustrating methods of manufacturing the semiconductor light emitting device according to the embodiment.

First, as illustrated in FIG. 4A, the first semiconductor layer 51 is formed on a substrate 10 that is, for example, sapphire substrate, the active layer 53 is formed on the first semiconductor layer 51, and the second semiconductor layer 52 is formed on the active layer 53.

Next, the metal layer 20A is formed on the second semiconductor layer 52. Thereafter, to ensure a sufficient ohmic contact between the metal layer 20A and the second semiconductor layer 52, annealing is performed for a predetermined period. Next, a silicon oxide film 201A is, for example, formed as the transfer film by vacuum deposition. Then, a layer of electron beam resist film 200A is formed on the silicon oxide film 201A.

Figure 4B:
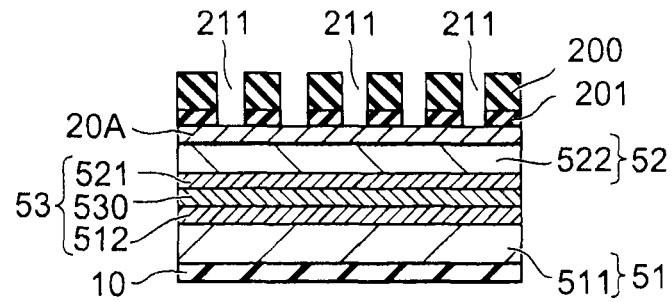

Next, as illustrated in FIG. 4B, resist openings 211 corresponding to the openings 21 are formed in the resist film 200A using an electron beam exposure apparatus equipped with a pattern generator.

Figure 4C:
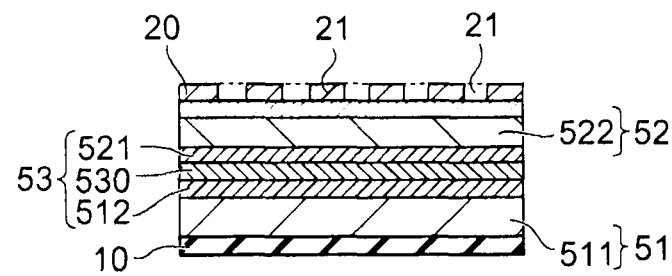

Next, using an electron beam resist layer 200 having the resist openings 211 formed therein as a mask, the pattern of the resist layer 200 is transferred to the silicon oxide film 201A that is the transfer layer using reactive ion etching (RIE). Next, with a silicon oxide layer 201 that includes openings as a mask, the metal layer 20A is etched by ion milling. As a result, the openings 21 that correspond to resist openings 211 are formed in the metal layer 20A (FIG. 4C). The metal layer 20A in which the openings 21 are formed becomes the second electrode layer 20. After etching of the metal layer 20A, the silicon oxide layer 201 is removed.

Figure 4D:
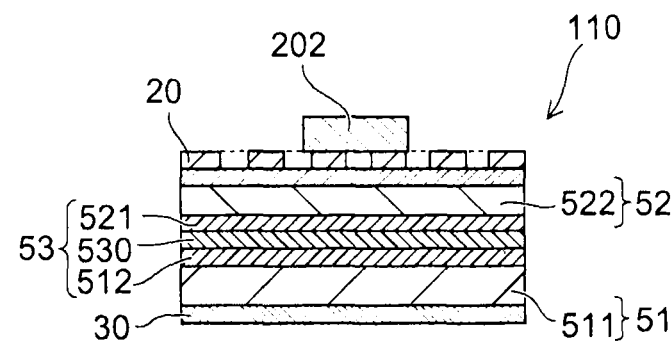

Thereafter, as illustrated in FIG. 4D, a pad electrode 202 is formed on the metal layer 20A.

Next, an electrode-protecting resin is coated on the second electrode layer 20 side, which is the top surface, and a reinforcing substrate (not illustrated) is adhered.

Thereafter, the epitaxial layers are separated from the substrate 10, which is the sapphire substrate or the like, using a laser lift off (LLO) method in which irradiation is performed with Krypton Fluoride (KrF) excimer laser light with a wavelength of 248 nm from the substrate 10 side and the boundary region of the substrate 10 and GaN absorbs the laser light. The gallium remaining on the back surface is removed by a hydrochloric acid treatment.

Next, the back surface from which the gallium has been removed is sputtered with silver and subsequently plated with silver to a thickness of approximately 50 μm to form the first electrode layer 30.

The reinforcing substrate (not illustrated) is removed by dissolving the resin of the top surface using an organic solvent. Lastly, the devices are divided by dicing to complete the semiconductor light emitting device 110.

(B) Method Using a Stamper

Another method for manufacturing a semiconductor light emitting device according to the embodiment is to use a stamper. The method includes the following processes.

Specifically, the manufacturing method includes: forming a structure on a substrate by epitaxial crystal growth, the structure including a first semiconductor layer of a first conductivity type, a second semiconductor layer of a second conductivity type and a light emitting layer provided between the first semiconductor layer and the second semiconductor layer, and forming a metal layer on the second semiconductor layer (b1); forming a resist film on the metal layer (b2); pressing the resist film with concave-convexes of a stamper to form a plurality of concaves in the resist film (b3); etching the metal layer using the resist film as a mask to form a second electrode layer having a plurality of openings corresponding to the concaves (b4); and, after separating the substrate from the structure, forming a first electrode layer made of metal and containing a portion contacting the first semiconductor layer on the first semiconductor layer side of the structure, (b5).

Also, in the forming of the second electrode layer (b4) in the embodiment, the plurality of openings is formed with each having an equivalent circle diameter of not less than 10 nm and not more than 5 μm.

Specifically, the semiconductor light emitting device can be obtained as follows, for example.

FIGS. 5A to 5F are schematic cross-sectional views illustrating an example of a process of the method using the stamper.

Figure 5A:
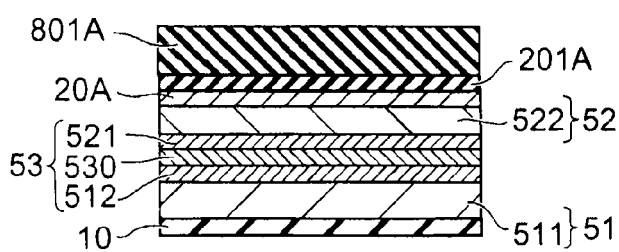

First, as illustrated in FIG. 5A, the first semiconductor layer 51 is formed on a substrate 10 that is, for example, sapphire substrate, the active layer 53 is formed on the first semiconductor layer 51, and the second semiconductor layer 52 is formed on the active layer 53.

Next, the metal layer 20A is formed on the second semiconductor layer 52. Thereafter, to ensure a sufficient ohmic contact between the metal layer 20A and the second semiconductor layer 52, annealing is performed for a predetermined period. Then, silicon oxide film 201A is, for example, formed by vacuum deposition as the transfer film on the metal layer 20A. Further, a layer of a resist film 801A is formed.

Figure 5E:
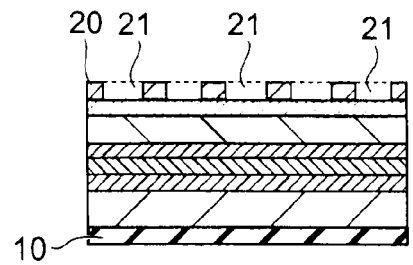
Figure 5B:
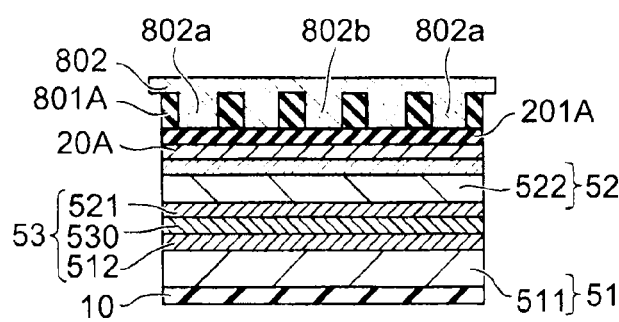

Next, a stamper 802 is prepared having concave-convexes 802a as illustrated in FIG. 5B.

For example, a plurality of the protrusions 802a is provided in a transfer face of the stamper 802.

The stamper 802 can be manufactured by, for example, forming a desired structure using electron beam lithography. Note that the method for forming the stamper 802 and a microstructure of concave-convexes in the stamper 802 is not limited to this method. For example, the stamper 802 can be formed by later-described methods using self-assembly with a block copolymer or a method using a nanoparticle.

Next, as illustrated in FIG. 5B, the transfer face of the stamper 802 having the concave-convexes is pressed into the resist film 801A to perform imprinting. The resist film 801A may be heated to a predetermined temperature if necessary. After imprinting, the resist film 801A is cooled to room temperature and allowed to harden, and the stamper 802 is released. In this way, a resist pattern 801B is formed having concaves corresponding to the concave-convexes 802a, as illustrated in FIG. 5C. The above has described an example of thermal imprinting, but UV imprinting may also be used.

Figure 5F:
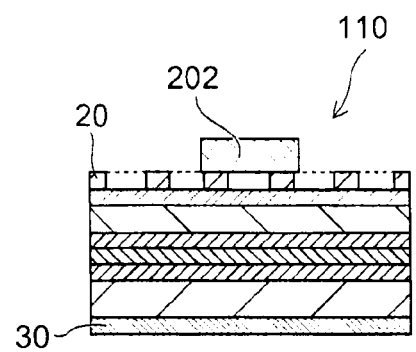
Figure 5C:
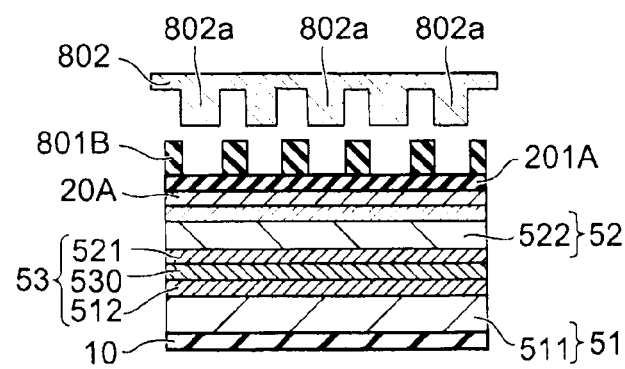
Figure 5D:
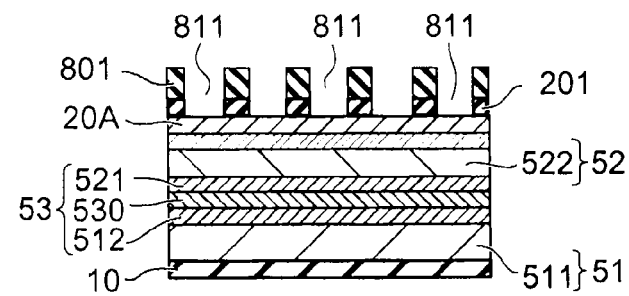

Next, as illustrated in FIG. 5D, the resist pattern 801B is etched. With the etching, bottoms of the concaves of the resist layer are removed, and the metal layer 20A is exposed (FIG. 5D). Portions where the metal layer 20A is exposed become resist openings 811. Next, the pattern of the resist layer 801 is transferred by Reactive Ion Etching (RIE) of the silicon oxide film 800A of the transfer layer.

Next, the metal layer 20A is etched by ion milling using as a mask a silicon oxide layer 801 in which openings of the same shape as the resist openings 811 have been formed. As a result, the openings 21 that correspond to the resist openings 811 are formed in the metal layer 20A (FIG. 5E). The metal layer 20A in which the openings 21 are formed becomes the second electrode layer 20. After etching of the metal layer 20A, the silicon oxide layer 801 is removed.

Thereafter, as illustrated in FIG. 5F, a pad electrode 202 is formed on the metal layer 20A.

Next, an electrode-protecting resin is coated on the second electrode layer 20 side, which is the top surface, and a reinforcing substrate (not illustrated) is adhered.

Thereafter, the epitaxial substrate is separated from the growth-use substrate 10, which is the sapphire substrate or the like, using a laser lift off (LLO) method in which irradiation is performed with KrF excimer laser light with a wavelength of 248 nm from the substrate 10 side and the boundary region of the substrate 10 and GaN absorbs the laser light. The gallium remaining on the back surface is removed by a hydrochloric acid treatment.

Next, the back surface from which the gallium has been removed is sputtered with silver and subsequently plated with silver to a thickness of approximately 50 μm to form the first electrode layer 30.

The reinforcing substrate (not illustrated) is removed by dissolving the resin of the top surface using an organic solvent. Lastly, the devices are divided by dicing to complete the semiconductor light emitting device 110.

The method of using a stamper is not limited to forming using heat as described above, and various technologies may be used, such as forming by hardening the resist with light irradiation, forming by means of a stamper made of flexible material such as poly dimethylacrylamide (PDMA), poly dimethylsiloxane (PDMS) or the like.

(C) Method Using the Self-Assembling of Block Copolymers

Another method for manufacturing a semiconductor light emitting device according to the second embodiment is to use phase separation by the self-assembling of block copolymers. The method includes the following processes.

Specifically, the manufacturing method includes: forming by crystal growth a structure including, on a substrate, a first semiconductor layer of a first conductivity type, a second semiconductor layer of a second conductivity type and a light emitting layer provided between the first semiconductor layer and the second semiconductor layer, and forming a metal layer on the second semiconductor layer (c1); coating a top surface of at least a portion of the metal layer with a composition containing a block copolymer, and generating a microdomain pattern by phase separation of the block copolymer (c2); etching the metal layer with the microdomain pattern as a mask to form a second electrode layer having a plurality of openings (c3), and, after separating the substrate from the structure, forming, on the first semiconductor layer side of the structure, a first electrode layer made of metal and containing a portion contacting the first semiconductor layer (c4).

Also, in the forming of the second electrode layer (c3) in the embodiment, the plurality of openings is formed with each having an equivalent circle diameter of not less than 10 nm and not more than 5 µm.

Specifically, the semiconductor light emitting device can be obtained as follows, for example.

FIGS. 6A to 6F are schematic cross-sectional views illustrating an example of a process of the method using the self-assembling of block copolymers.

Figure 6A:
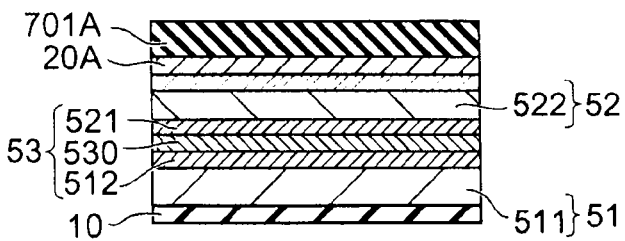

First, as illustrated in FIG. 6A, the first semiconductor layer 51 is formed on a substrate 10 that is, for example, sapphire substrate, the active layer 53 is formed on the first semiconductor layer 51, and the second semiconductor layer 52 is formed on the active layer 53.

Next, a contact layer 14 is formed on the second semiconductor layer 52, and the metal layer 20A is formed on the contact layer 14. Thereafter, to ensure a sufficient ohmic contact between the metal layer 20A and the second semiconductor layer 52, annealing is performed for a predetermined period. Then, silicon oxide film 701A is formed on the metal layer 20A.

Figure 6E:
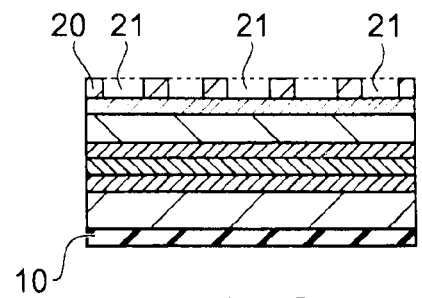
Figure 6B:
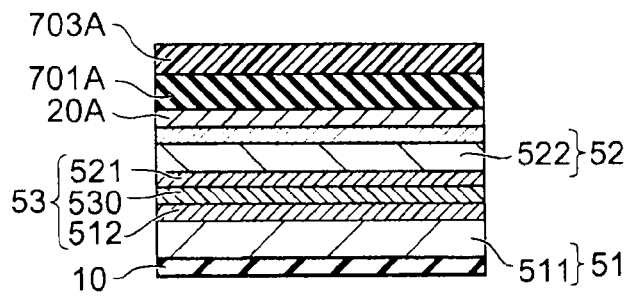
Figure 6F:
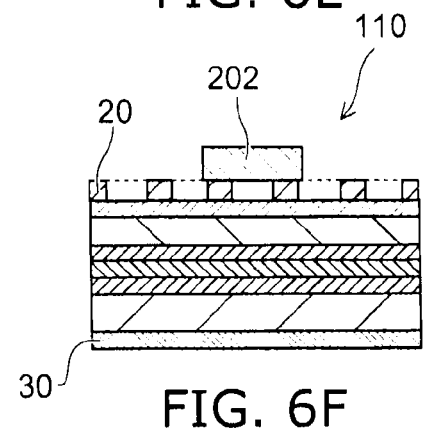
Figure 6C:
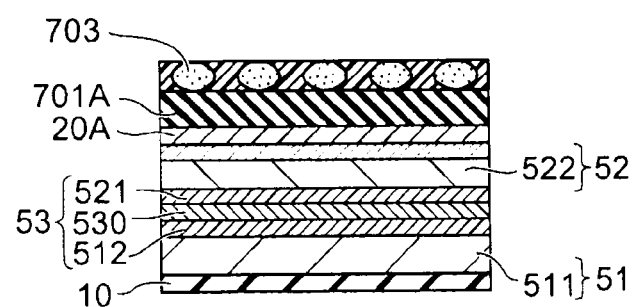

Next, as illustrated in FIG. 6B, a solvent in which block copolymers having two types of polymer block are dissolved is applied on the silicon oxide film 701A by a spin coating method. Thereafter, pre-baking is carried out to remove the solvent and to form a block copolymer film 703A. Then, the film is annealed, microphase separation of the two types of polymer is performed, and a microdomain pattern 703 is formed by the block copolymers (FIG. 6C).

Next, the microdomain pattern 703 is etched using, for example, an RIE apparatus. Here, due to the difference in the etching speeds of the two types of polymer, a hole pattern is formed by a polymer with the faster etching speed.

Figure 6D:
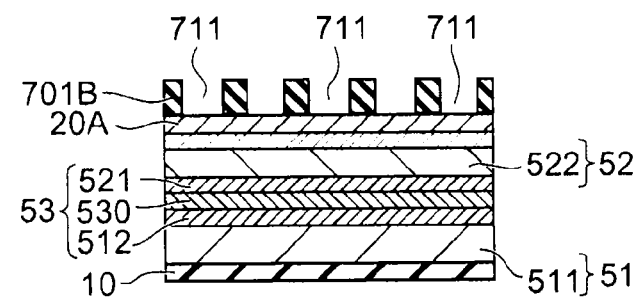

Next, the silicon oxide film 701A is etched using, for example, RIE apparatus with the hole pattern from the polymer as a mask to form an oxide film hole pattern 701B (FIG. 6D). The oxide film hole pattern 701B has a hole pattern 711 corresponding to the openings 21 formed therein.

Next, the metal layer 20A is etched by ion milling with the oxide film hole pattern 701B as a mask. As a result, the openings 21 that correspond to the hole pattern 711 are formed in the metal layer 20A (FIG. 6E). The metal layer 20A in which the openings 21 are formed becomes the second electrode layer 20. After etching the metal layer 20A, the oxide film hole pattern 701B is removed.

Thereafter, as illustrated in FIG. 6 (f), a pad electrode 202 is formed on the metal layer 20A.

Next, an electrode-protecting resin is coated on the second electrode layer 20 side, which is the top surface, and a reinforcing substrate (not illustrated) is adhered.

Thereafter, the epitaxial layers are separated from the substrate 10, which is the sapphire substrate or the like, using a laser lift off (LLO) method in which irradiation is performed with KrF excimer laser light with a wavelength of 248 nm from the substrate 10 side and the boundary region of the substrate 10 and GaN absorbs the laser light. The gallium remaining on the back surface is removed by a hydrochloric acid treatment.

Next, the back surface from which the gallium has been removed is sputtered with silver and subsequently plated with silver to a thickness of approximately 50 µm to form the first electrode layer 30.

The reinforcing substrate (not illustrated) is removed by dissolving the resin of the top surface using an organic solvent. Lastly, the devices are divided by dicing to complete the semiconductor light emitting device 110.

(D) Method Using a Mask Formed of Nanoparticles

A further method for manufacturing a semiconductor light emitting device according to the second embodiment is to use a monomolecular particle layer of nanoparticles, such as silica particles, as a mask. The method includes the following processes.

Specifically, the manufacturing method includes: forming by crystal growth a structure including, on a substrate, a first semiconductor layer of a first conductivity type, a second semiconductor layer of a second conductivity type and a light emitting layer provided between the first semiconductor layer and the second semiconductor layer, and forming a metal layer on the second semiconductor layer (d1); forming a resist film on the metal layer (d2); forming a single particle layer of nanoparticles on a top surface of the resist film (d3); etching the resist film with the single particle layer as a mask to form a resist layer having openings (d4); filling the openings of the resist layer with an inorganic material to form a reverse pattern mask (d5); etching the metal layer with the reverse pattern mask as a mask to form the second electrode layer having a plurality of openings (d6); and, after separating the substrate from the structure, forming, on the first semiconductor layer side of the structure, a first electrode layer made of metal and containing a portion contacting the first semiconductor layer (d7).

Also, in the forming of the second electrode layer (d6) in the embodiment, the plurality of openings is formed with each having an equivalent circle diameter of not less than 10 nm and not more than 5 µm.

Specifically, the semiconductor light emitting device can be obtained as follows, for example.

FIGS. 7A to 7H are schematic cross-sectional views illustrating an example of a process of the method using nanoparticles as the mask.

Figure 7A:
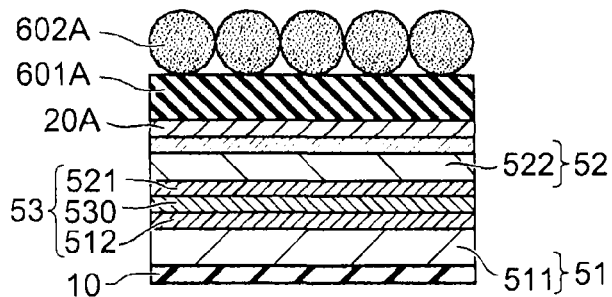

First, as illustrated in FIG. 7A, the first semiconductor layer 51 is formed on the substrate 10, the active layer 53 is formed on the first semiconductor layer 51, and the second semiconductor layer 52 is formed on the active layer 53.

Next, a contact layer 14 is formed on the second semiconductor layer 52, and the metal layer 20A is formed on the contact layer 14. Thereafter, to ensure a sufficient ohmic contact between the metal layer 20A and the second semiconductor layer 52, annealing is performed for a predetermined period. Then, a resist film 601A is formed on the metal layer 20A.

Next, a monomer is added to, for example, solution of ethyl lactate with diffused silica nanoparticles to form a slurry. The slurry is dripped onto the resist film 601A and spin coating is performed. After the spin coating, the solution is removed. In this way, a monomolecular layer of nanoparticles 602A with a regular arrangement is formed.

Figure 7E:
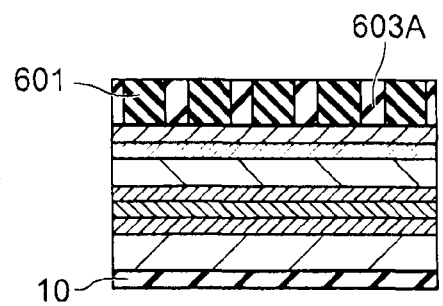
Figure 7B:
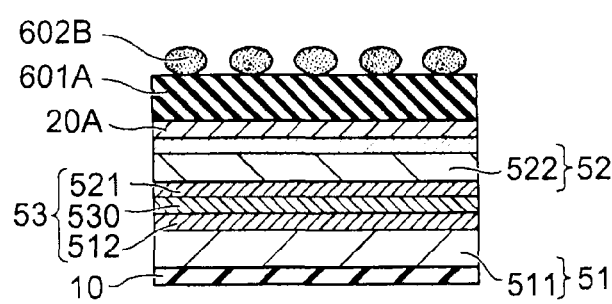

Next, as illustrated in FIG. 7B, the arranged layer of nanoparticles 602A is etched using RIE apparatus and the grain size of the nanoparticles is reduced. Gaps are generated between the reduced-size nanoparticles 602B.

Figure 7F:
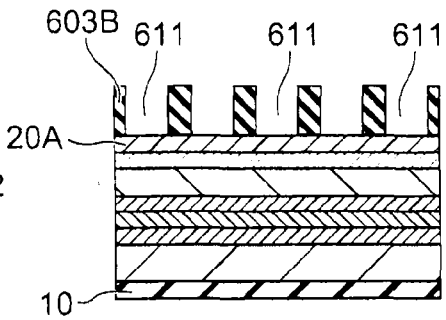
Figure 7C:
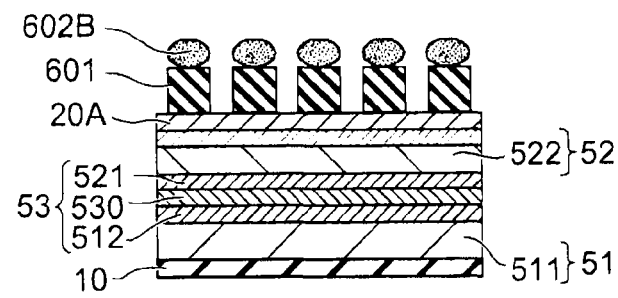

Next, as illustrated in FIG. 7C, the resist film 601A is etched with the nanoparticles 602B as the mask to form a resist pillar pattern 601.

Figure 7G:
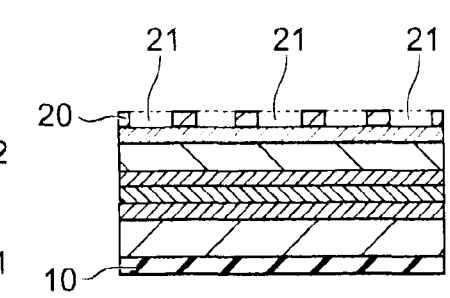
Figure 7D:
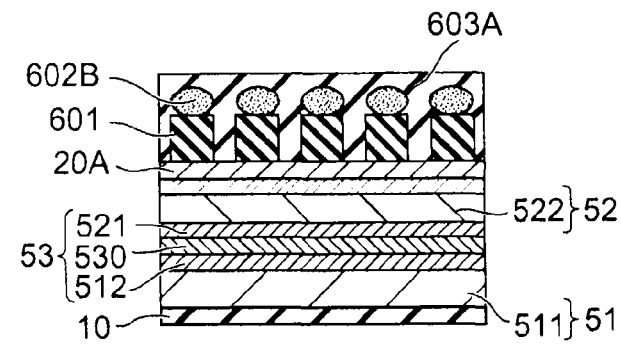

Next, as illustrated in FIG. 7D, an organic SOG composition is, for example, dropped onto the resist pillar pattern 601 and spin coating is performed. After the spin coating, the solution is completely removed and annealing is performed. After the organic SOG composition has hardened, the resist pillar pattern 601 is buried by an SOG layer 603A. The top surface of the SOG layer 603A is then flattened.

Next, as illustrated in FIG. 7E, the SOG layer 603A is etched to expose the resist pillar pattern 601. Next, the resist pillar pattern 601 is completely removed by etching. After removing the resist pillar pattern 601, an SOG hole pattern 603B is formed, as illustrated in FIG. 7F. Openings in the hole pattern 603B form an opening pattern 611 that corresponds to the openings 21.

Next, with the SOG hole pattern 603B as a mask, the metal layer 20A is etched using ion milling. As a result, the openings 21 that correspond to the opening pattern 611 are formed in the metal layer 20A (FIG. 7G). The metal layer 20A in which the openings 21 are formed becomes the second electrode layer 20. After the etching of the metal layer 20A, the SOG hole pattern 603B is removed.

Figure 7H:
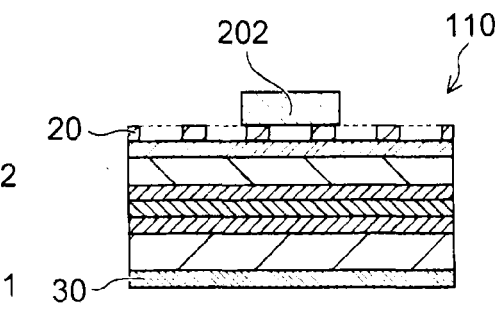

Thereafter, as illustrated in FIG. 7H, a pad electrode 202 is formed on the metal layer 20A.

Next, an electrode-protecting resin is coated on the second electrode layer 20 side, which is the top surface, and a reinforcing substrate (not illustrated) is adhered.

Thereafter, the epitaxial layers are separated from the substrate 10, which is the sapphire substrate or the like, using a laser lift off (LLO) method in which the arrangement is irradiated with KrF excimer laser light with a wavelength of 248 nm from the substrate 10 side and the boundary region of the substrate 10 and GaN absorbs the laser light. The gallium remaining on the back surface is removed by a hydrochloric acid treatment.

Next, the back surface from which the gallium has been removed is sputtered with silver and subsequently plated with silver to a thickness of approximately 50 µm to form the first electrode layer 30.

The reinforcing substrate (not illustrated) is removed by dissolving the resin of the top surface using an organic solvent. Lastly, the devices are divided by dicing to complete the semiconductor light emitting device 110.

The above manufacturing methods (A) through (D) are examples, and the embodiment is not limited to these.

Next, examples are explained. The materials, values, manufacturing conditions, and the like indicated in the following examples are examples, and the invention is not limited to these examples.

First Example

In a first example, a semiconductor light emitting device 111 is manufactured in accordance with the method using electron beam lithography as described in (A) above.

First, the GaN current diffusion layer 511 is formed on the substrate 10. Next, a heterostructure including the n-type GaN cladding layer 512, the InGaN light emitting layer 530, and the p-type AlGaN cladding layer 521 is formed on the current diffusion layer 511. A current diffusion layer 522 containing p-type GaN is then epitaxially grown on the heterostructure.

Next, the metal layer 20A made up from the stacked film of Ni (1 nm)/Ag—Pd—Cu (30 nm) is formed by a deposition method. Thereafter, annealing is carried out in a nitrogen atmosphere for 30 minutes at 600° C., to obtain ohmic contact with the metal layer 20A.

Next, a layer of electrode beam resist (FEP 301 (trade name) made by FUJIFILM Corp.) is formed on the Ag—Pd—Cu layer to a thickness of 300 nm. Then, hole patterns (resist openings 202a) with opening diameters of 100 nm and gaps of 150 nm are formed in the electron beam resist using an electron beam exposure apparatus equipped with a pattern generator and having an acceleration voltage of 50 kV.

Next, openings are formed by carrying out etching for 90 seconds using an ion milling apparatus under the conditions of an acceleration voltage of 500 volts (V) and an ion current of 40 milliamperes (mA). As a result, the second electrode layer 20 having the openings 21 is formed.

Then, a pad electrode 202 is formed on the Ni/Ag—Pd—Cu layer. Then, the substrate 10 is separated from the bottom surface of the current diffusion layer 511 and the first electrode layer 30 is formed on the bottom surface of the current diffusion layer 511 to complete the semiconductor light emitting device 111.

Second Example

In a second example, the semiconductor light emitting device 112 is manufactured in accordance with the method using the self-assembling of block copolymers as described in (C) above.

First, as in the first example, the current diffusion layer of GaN is formed on the substrate 10. Next, a heterostructure including the n-type GaN cladding layer 512, the InGaN light emitting layer 530, and the p-type AlGaN cladding layer 521 is formed on the current diffusion layer 511. A current diffusion layer 522 containing p-type GaN is then epitaxially grown on the heterostructure.

Next, the metal layer 20A formed from Ni (1 nm)/Ag—Pd—Cu (30 nm) is formed by a deposition method. Thereafter, annealing is carried out in a nitrogen atmosphere for 30 minutes at 450° C., to obtain ohmic contact with the metal layer 20A. Next, a silicon oxide film is formed to a thickness of 50 nm by CVD.

For the block polymer, a block copolymer (PS-b-PMMA) of polystyrene (PS) and polymethyl methacrylate (PMMA) are used. A molecular weight of the block polymer (Mn) is 920 kg/mol and the composition ratio of PS and PMMA is 80 mol:20 mol. Note that, besides PS-b-PMMA, a microdomain pattern may be created using, for example, a block polymer described in the specification of Japanese Patent No. 3940546. The PS-b-PMMA is then dissolved in propylene glycol monomethyl ether acetate (PGMEA) to form a block copolymer resist.

Next, the block copolymer resist is spin-coated onto the silicon oxide film, and annealed at 230° C. in a non-oxidizing oven. As a result, PMMA spherical domains with a diameter of 120 nm are formed in the block copolymer. A film thickness of the PS-b-PMMA block copolymer is adjusted so that 1 layer of PMMA spherical domains is formed.

PMMA has no resistance to RIE. Hence, the block copolymer is selectively removed by oxygen RIE etching. In this way, the PMMA domain portions are removed. Then, with the PS that remains in a mesh-like state as the mask, the arrangement is subjected to RIE using a gas mixture of $CF_4$ and Ar, and then ashing is performed with oxygen. As a result, an oxide film mask (oxide film hole pattern 701B) having the hole pattern 711 that corresponds to the openings 21 is formed.

Next, the Ag—Pd—Cu layer is milled via the oxide film mask using argon. As a result, a metal thin film electrode with light transmittivity (the second electrode layer 20) is formed.

After etching the Ni/Ag—Pd—Cu layers, the oxide film mask is removed. Then, a pad electrode 202 is formed on the Ni/Ag—Pd—Cu layer. Then, the substrate 10 is separated from the bottom surface of the current diffusion layer 511 and the first electrode layer 30 is formed on the bottom surface of the current diffusion layer 511 to complete the semiconductor light emitting device 112.

Reference Example

For comparison, a semiconductor light emitting device 191 is formed in which only a circular pad electrode is formed on the second semiconductor layer 52 (Reference Example 1).

Further, a semiconductor light emitting device 192 of the type shown in FIG. 2B is formed with a second electrode layer 20 having openings 21 in the manner of the semiconductor light emitting device 190 illustrated in FIG. 2B, and a first electrode provided on a portion of the first semiconductor layer of the structure 100 (Reference Example 2).

The semiconductor light emitting devices 111, 112, 191 and 192 are 300 μm squares formed by dicing. A comparison of the characteristics of the semiconductor light emitting devices 111, 112, 191 and 192 is carried out for bare chips.

Figure 8:
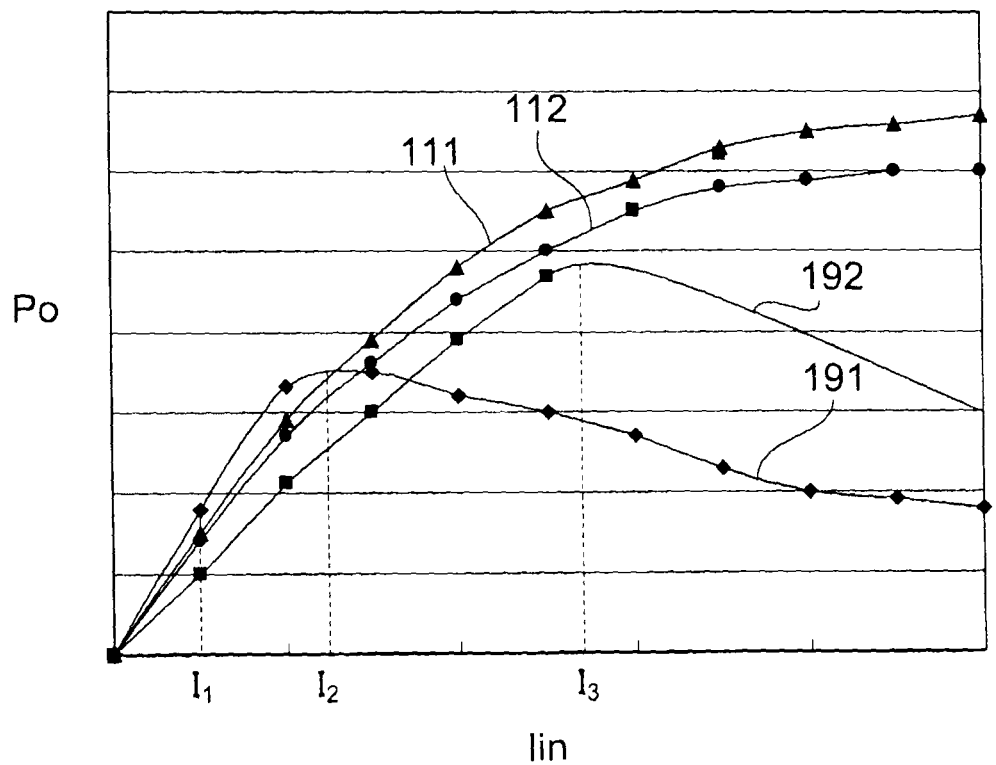
FIG. 8 is a graph illustrating an example of the characteristics of semiconductor light emitting devices.

FIG. 8 is a graph illustrating an example of the characteristics of the examples and the comparative examples.

In FIG. 8, the horizontal axis is the current, and the vertical axis is the power.

In the semiconductor light emitting devices 111, 112 and 192 having the openings 21, the voltage value in the low voltage region is lower than the voltage value in the semiconductor light emitting device 191 that does not have the openings 21 at the same current value.

However, when the current is increased and exceeds the current value $I_2$, the power output of semiconductor light emitting device 191 reduces. Hence, the brightness is substantially reduced.

In contrast, with the semiconductor light emitting device 111, 112 and 192, there is no reduction in power when the current value exceeds $I_2$ and reaches $I_3$.

The reason for this is that the provision of the second electrode layer 20 on the top side of the structure 100 results in an improvement in the uniformity of current diffusion and heat dissipation of the semiconductor light emitting devices 111, 112 and 192.

Here, among the semiconductor light emitting devices 111, 112 and 192, the semiconductor light emitting device 192 shows a reduction in power in a high current region above the current value I3. The reduction in power is considered to be due to the concentration of current in the region of the first electrode layer 39 as the current value increases and the heating effect results from the current concentration.

In contrast, in the semiconductor light emitting devices 111 and 112 of the first and second embodiments, in the low current region the power is maintained at approximately the same level as the power of the semiconductor light emitting device 191.

Further, no reduction in power occurs in the high current region.

From the above, it can be seen that the semiconductor light emitting devices 111 and 112 have extremely good light emission characteristics from the low current region to the high current region. These types of light emission characteristics are advantageous in large chips of say 1 mm square, in other words chips in which an area an outline of the second electrode layer 20 is not less than 1 mm$^2$, and when a high current is flowing.

Also, the effect of improvement in the characteristics of the semiconductor light emitting devices 111 and 112 is marked when the current is 100 mA or greater, although this also depends on the area of the second electrode layer 20.

(Variation)

Figure 9:
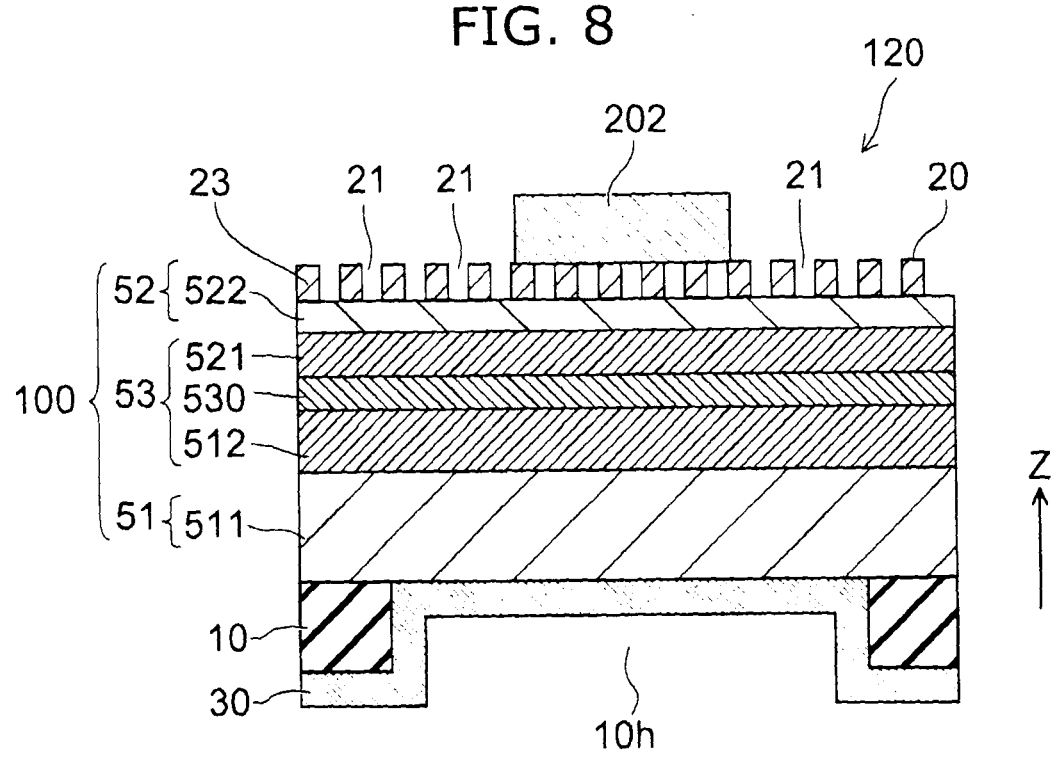
FIG. 9 is a schematic cross-sectional view illustrating a semiconductor light emitting device according to a variation of the embodiment.

FIG. 9 is a schematic cross-sectional view illustrating a semiconductor light emitting device according to a variation.

In the semiconductor light emitting device 120 according to this variation, a support substrate is provided on the first semiconductor layer 51 side of the structure 100. The support substrate is provided with through holes 10h that pierce the support substrate in the Z-axis direction. The first electrode layer 30 contacts the first semiconductor layer 51 via the through holes 10h. Here, a support substrate 10S may be the substrate 10.

In a semiconductor light emitting device 120 according to this variation, a nitride semiconductor is used as the material of the structure 100.

In other words, in the semiconductor light emitting device 120, the substrate 10 (a sapphire substrate, for example) is used as the support substrate 10S. In the semiconductor light emitting device 120, the GaN current diffusion layer 511, the n-type GaN cladding layer 512 doped with Si, the light emitting layer 530 having an InGaN/GaN multi quantum well (MQW) structure, the p-type $Al_{0.2}Ga_{0.8}N$ cladding layer 521 doped with Mg, and the p-type GaN current diffusion layer 522 doped with Mg are, for example, formed by epitaxial growth on the substrate 10.

The second electrode layer 20 having the openings 21 is provided on the current diffusion layer 522. Further, the through hole 10h of the support substrate 10S reaches from the bottom surface side of the support substrate 10S to the current diffusion layer 511. The first electrode layer 30 is formed on the bottom surface side of the support substrate 10S and covering the through hole 10h so as to contact the current diffusion layer 511 in the through hole 10h portion.

As with the semiconductor light emitting device 110, the semiconductor light emitting device 120 according to this variation makes it possible for light to be emitted efficiently to the outside while the diffusion of current to the light emitting layer given by the second electrode layer 20 is maintained.

Note that although in the above embodiments, examples in which nitride semiconductors were used as the structure 100 were described, semiconductor other than a nitride semiconductors may be used. For instance, n-type GaAs may be used as the current diffusion layer 511, n-type InAlP as the cladding layer 512, InGaP as the light emitting layer 3, p-type InAlP as the cladding layer 521 and p-type InGaAlP as the current diffusion layer 522.

Moreover, although the first conductivity type was described as being n-type and the second conductivity type as being p-type, implementation is possible with the first conductivity type as p-type and the second conductivity type as n-type.

As described above, the semiconductor light emitting device and the manufacturing method according to the embodiments make it possible to enhance light emission efficiency (light extraction efficiency) and enhance brightness while maintaining uniform current diffusion to the semiconductor layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light emitting device comprising:
   a first electrode layer;
   a second electrode layer;
   a first semiconductor layer of a first conductivity type provided between the first electrode layer and the second electrode layer, the first semiconductor layer including a first nitride semiconductor;
   a second semiconductor layer of a second conductivity type provided between the first semiconductor layer and the second electrode layer, the second semiconductor layer including a second nitride semiconductor; and
   a light emitting layer provided between the first semiconductor layer and the second semiconductor layer, the light emitting layer including a third nitride semiconductor;
   a distance between the first electrode layer and the second electrode layer being not more than 20 micrometers,
   the first electrode layer including a metal layer, the metal layer contacting the first semiconductor layer, and a thickness of the metal layer being not less than 1 micrometer; and
   the second electrode layer including a metal portion and a plurality of openings piercing the metal portion in a direction from the second semiconductor layer toward the first semiconductor layer, the metal portion directly contacting the second semiconductor layer, a thickness of the metal portion being not less than 10 nanometers and not more than 50 nanometers, and each of the openings viewed in the direction having an equivalent circle diameter of not less than 10 nanometers and not more than 5 micrometers.

2. The device according to claim 1, wherein the first electrode layer is formed by plating.

3. The device according to claim 1, wherein the metal portion contains silver.

4. The device according to claim 1, wherein the equivalent circle diameter is not more than ½ of a center wavelength of the light.

5. The device according to claim 1, wherein the second electrode layer is in ohmic contact with the second semiconductor layer.

6. The device according to claim 1, wherein the light emitting layer emits light with a central wavelength of not less than 400 nanometers and not more than 650 nanometers.

7. The device according to claim 1, wherein a sheet resistance of the second electrode layer is not more than 10 Ω/square.

8. The device according to claim 1, wherein the thickness of the first electrode layer is not more than 500 micrometers.

9. The device according to claim 1, wherein a light emitted from the light emitting layer light is blue light.

10. The device according to claim 1, wherein
    the first semiconductor layer, the light emitting layer and the second semiconductor layer are formed on a substrate, and
    the first electrode layer is formed at a face of the first semiconductor layer exposed by removing the substrate.

11. The device according to claim 1, wherein the metal layer is a silver layer and the metal portion contains silver.

12. The device according to claim 1, further comprising a support substrate,
    a part of the support substrate being disposed between the first electrode layer and the first semiconductor layer provided on the first semiconductor layer side of the structure,
    the support substrate layer including a through hole along the direction, and
    the first electrode layer contacts contacting the first semiconductor layer via the through hole.

13. The device according to claim 12, wherein the metal layer is a silver layer and the metal portion contains silver.

* * * * *